(12) United States Patent
Chae et al.

(10) Patent No.: US 10,770,513 B2
(45) Date of Patent: Sep. 8, 2020

(54) DISPLAY DEVICE

(71) Applicant: Samsung Display Co., Ltd., Yongin-si, Gyeonggi-Do (KR)

(72) Inventors: Seung-Yeon Chae, Hwaseong-si (KR); Sung-Young Choi, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/615,559

(22) Filed: Jun. 6, 2017

(65) Prior Publication Data

US 2018/0047790 A1 Feb. 15, 2018

(30) Foreign Application Priority Data

Aug. 11, 2016 (KR) .................. 10-2016-0102410

(51) Int. Cl.
*H01L 27/32* (2006.01)
*H01L 51/52* (2006.01)
(Continued)

(52) U.S. Cl.
CPC .............. *H01L 27/32* (2013.01); *G09F 19/12* (2013.01); *H01L 27/28* (2013.01); *H01L 27/3232* (2013.01); *H01L 27/3244* (2013.01); *H01L 27/3248* (2013.01); *H01L 45/14* (2013.01); *H01L 51/5281* (2013.01); *G09G 3/3433* (2013.01); *H01L 51/5284* (2013.01); *H01L 2227/32* (2013.01)

(58) Field of Classification Search
CPC . G02F 1/15; G02F 1/153; G02F 1/155; G02F 1/157; G02F 2001/1552; G02F 2001/1555; G02F 2201/44; G09G 3/38; H01L 27/3232; H01L 27/3267; H01L 51/5056; H01L 51/5072; H01L 51/5088
USPC .......................................................... 359/274
See application file for complete search history.

(56) References Cited

U.S. PATENT DOCUMENTS 4,758,830 A * 7/1988 Levien .................. G06F 3/0412
341/26
5,680,160 A * 10/1997 LaPointe .............. H01H 13/702
345/173
(Continued)

FOREIGN PATENT DOCUMENTS

EP           2040316 A1 * 3/2009 ......... H01L 51/5256
KR    10-2014-0087430       7/2014

*Primary Examiner* — Edward Chin
(74) *Attorney, Agent, or Firm* — Kile Park Reed & Houtteman PLLC

(57) ABSTRACT

A display device may include a first transistor, a first electrode, a second electrode, a first intermediate layer, and a first changeable layer. The first electrode is electrically connected to the first transistor. The second electrode overlaps the first electrode. The first intermediate layer is positioned between the first electrode and the second electrode and may emit first light when the first electrode and the second electrode generate a first electric field. The first changeable layer, which overlaps the first electrode, may have a first transmittance value when the first electrode and the second electrode generate the first electric field, and may have a second transmittance value when the first electrode and the second electrode do not generate the first electric field. The second transmittance value is unequal to the first transmittance value.

14 Claims, 16 Drawing Sheets

(51) Int. Cl.
    *G09F 19/12*         (2006.01)
    *H01L 27/28*         (2006.01)
    *G09G 3/34*          (2006.01)
    *H01L 45/00*         (2006.01)

(56) References Cited

U.S. PATENT DOCUMENTS

| | | | |
|---|---|---|---|
| 9,740,073 B2 * | 8/2017 | Oh | G02F 1/153 |
| 9,797,567 B2 * | 10/2017 | Kastner-Jung | B60Q 3/30 |
| 2003/0006411 A1 * | 1/2003 | Kido | H01L 51/0079 |
| | | | 257/40 |
| 2008/0297878 A1 * | 12/2008 | Brown | G02F 1/19 |
| | | | 359/263 |
| 2009/0091258 A1 * | 4/2009 | Heuser | H01L 51/5256 |
| | | | 313/512 |
| 2010/0019666 A1 | 1/2010 | Park et al. | |
| 2011/0316802 A1 | 12/2011 | Choi | |
| 2012/0280612 A1 | 11/2012 | Lee et al. | |
| 2013/0148199 A1 | 6/2013 | Jeon et al. | |
| 2014/0133282 A1 | 5/2014 | Hamm | |
| 2016/0233455 A1 * | 8/2016 | Riedel | H01L 22/20 |
| 2016/0266459 A1 * | 9/2016 | Oh | G09G 3/38 |

* cited by examiner

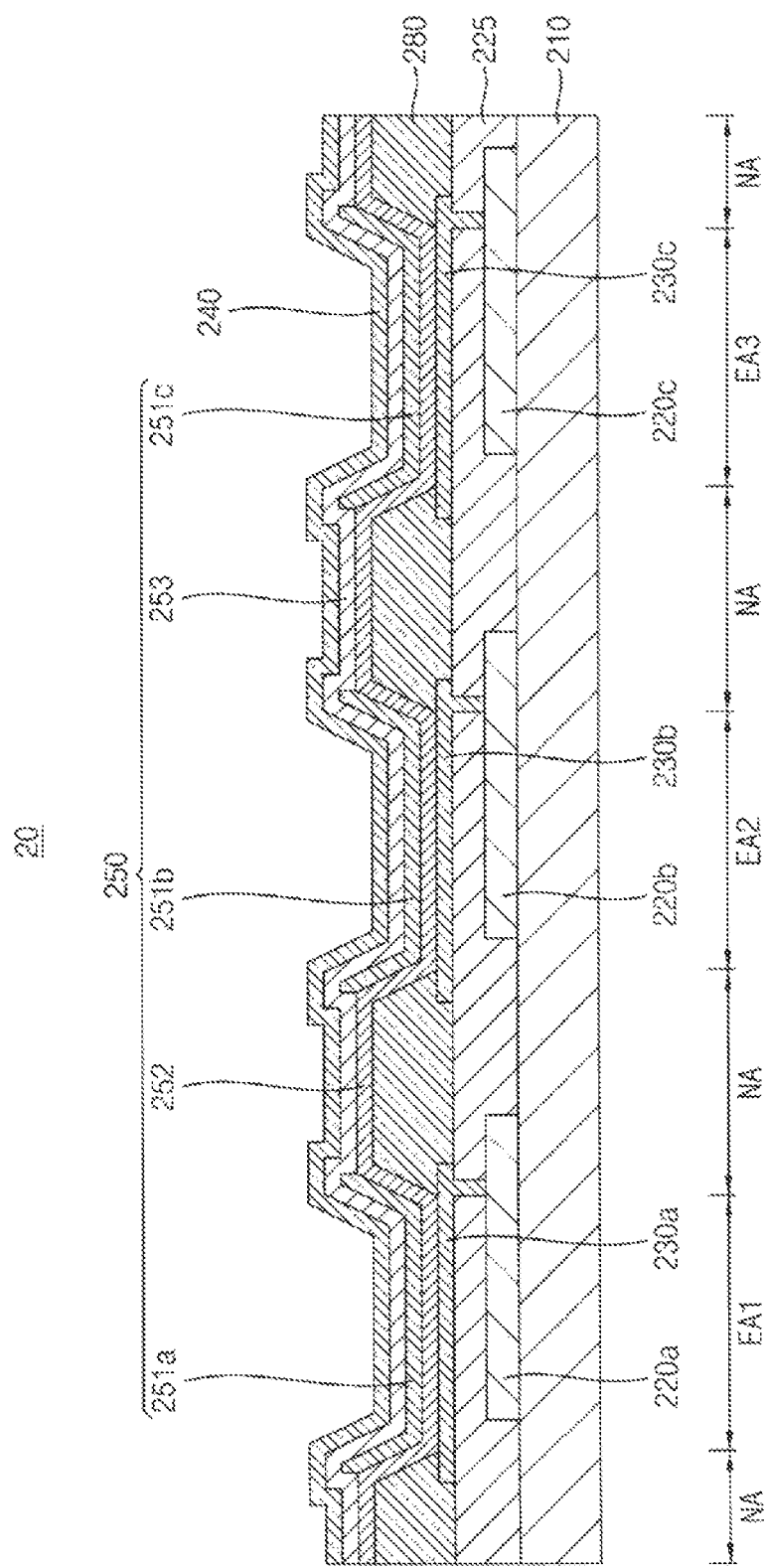

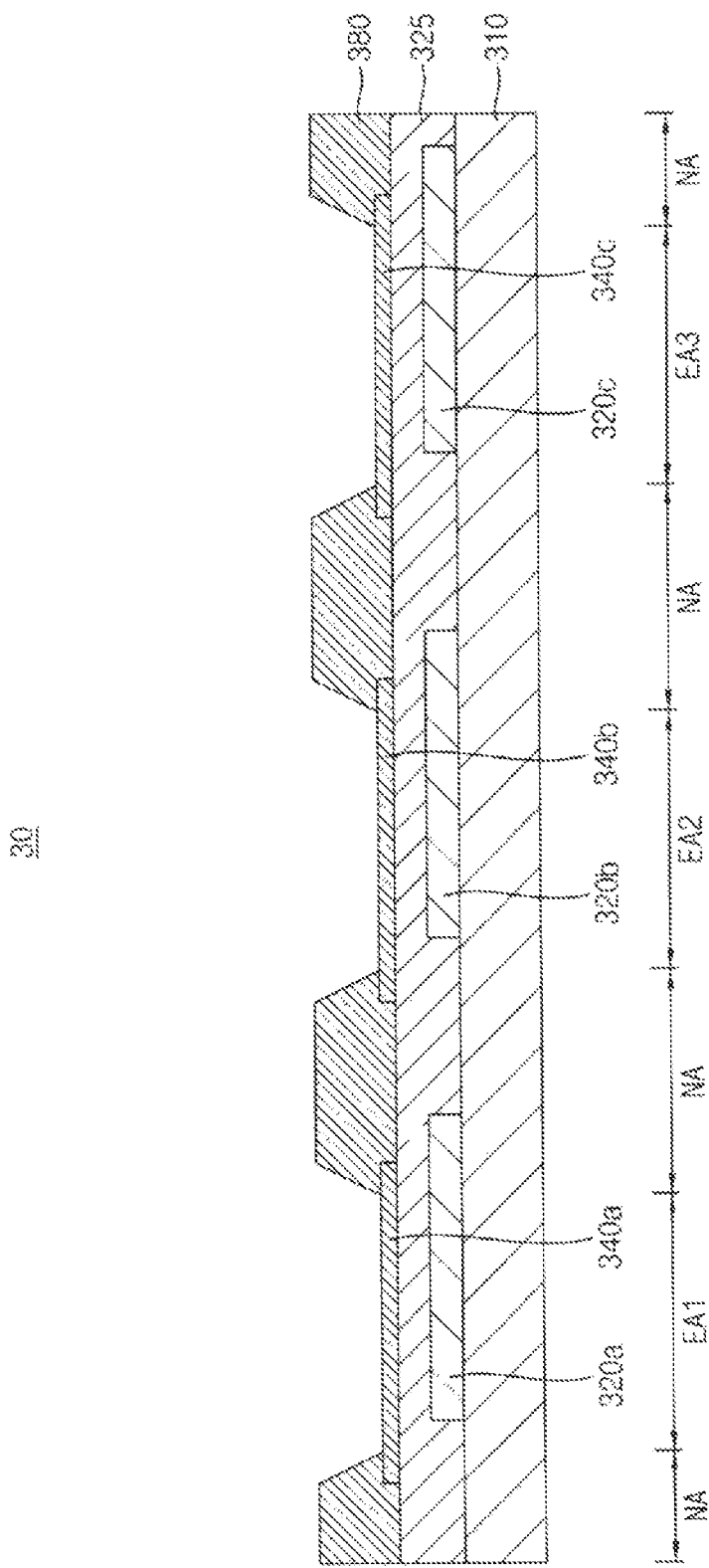

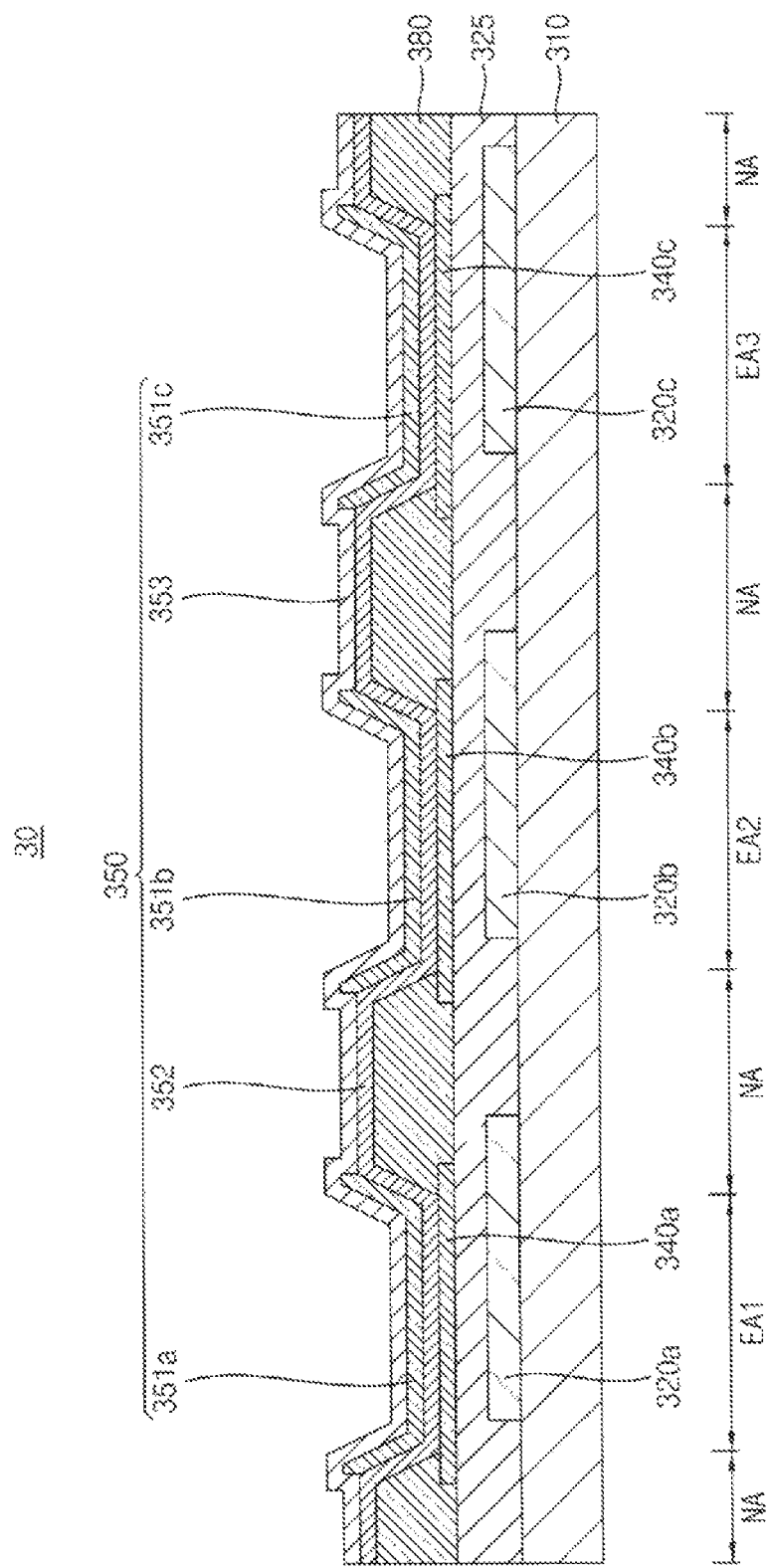

DISPLAY DEVICE

CROSS-REFERENCE TO RELATED APPLICATION(S)

This application claims priority under 35 USC § 119 to Korean Patent Application No. 10-2016-0102410, filed on Aug. 11, 2016 in the Korean Intellectual Property Office (KIPO); the entire disclosure of the Korean Patent Application is incorporated by reference herein.

BACKGROUND

1. Field

The technical field is related to display devices, such as organic light emitting display devices.

2. Description of the Related Art

A display device, such as an organic light emitting display (OLED) device, may include an OLED element including a hole injection electrode, an electron injection electrode, and an organic light emitting layer positioned between the electrodes. In the OLED device, light may be generated through combination of holes injected from the hole injection electrode and electrons injected from the electron injection electrode.

The OLED device may further include a circular polarizing film for mitigating effects of light reflection, in order to improve visibility of images displayed by the OLED device. However, the circular polarizing film may have a thickness greater than 100 micrometers, so that the OLED device may be undesirably thick.

SUMMARY

Example embodiments may be related to a display device, e.g., an organic light emitting display (OLED) device. The display device may reduce or substantially prevent undesirable reflection of external light without requiring an additional polarizer. Advantageously, image visibility associated with the display device may be satisfactory, and/or thinness of the display device may be satisfactory.

Example embodiments may be related to a display device. The display device may include a first transistor (e.g., 120a, 220a, or 320a illustrated in the drawings), a first electrode (e.g., 130a, 230a, 260a, or 330a), a second electrode (e.g., 140, 240, 340a, or 360), a first intermediate layer (e.g., 151a, 251a, or 351a), and a first changeable layer (e.g., 170a, a portion of 270 positioned over 230a, or 370a). The first electrode may be electrically connected to the first transistor. The second electrode may overlap the first electrode. The first intermediate layer may be positioned between the first electrode and the second electrode and may emit first light when the first electrode and the second electrode generate a first electric field. The first changeable layer, which may overlap the first electrode, may have a first transmittance value when the first electrode and the second electrode generate the first electric field, and may have a second transmittance value when the first electrode and the second electrode do not generate the first electric field. The second transmittance value may be unequal to the first transmittance value.

The first transmittance value may be greater than the second transmittance value.

The first changeable layer may be transparent when the first electrode and the second electrode generate the first electric field. The first changeable layer may be opaque when the first electrode and the second electrode generate no electric field or do not generate the first electric field.

The first changeable layer may directly contact at least one of the first electrode and the second electrode and may include an electrochromic element.

A first portion of the first changeable layer may be oriented at an obtuse angle with respect to a second portion of the first changeable layer.

The first changeable layer (e.g., 170a) may be positioned between the first intermediate layer and the second electrode.

The first intermediate layer (e.g., 151a) may be positioned between the first electrode and the first changeable layer.

The display device may include a second transistor, a third electrode, a second intermediate layer, and a second changeable layer (e.g., 170b, a portion of 270 positioned over 230b, or 370b). No intervening transistor may be positioned between the first transistor and the second transistor. The third electrode may be electrically connected to the second transistor. The second intermediate layer may be positioned between the third electrode and the second electrode and may emit second light when the third electrode and the second electrode generate a second electric field. The second changeable layer may overlap the third electrode, may have the first transmittance value when the third electrode and the second electrode generate the second electric field, and may have the second transmittance value when the third electrode and the second electrode do not generate the second electric field.

The display device may include a black member (e.g., 180, 280, or 380). The black member may be positioned between the first changeable layer and the second changeable layer.

The first intermediate layer may be positioned between the first changeable layer and the black member.

The black member may directly contact each of the first electrode and the third electrode.

A portion of the second electrode (e.g., a portion of 140) may be positioned between the first changeable layer and the second changeable layer and may directly contact each of the first changeable layer and the second changeable layer.

The display device may include a connection layer (e.g., a portion of 270 positioned over 280). The connection layer may be directly connected to each of the first changeable layer (e.g., a portion of 270 positioned over 230a) and the second changeable layer (e.g., a portion of 270 positioned over 230b). A material of the connection layer may be identical to each of a material of the first changeable layer and a material of the second changeable layer. The first changeable layer may be connected through the connection layer to the second changeable layer.

The connection layer may have a recess. The recess may be positioned between the first changeable layer and the second changeable layer.

The display device may include a black member (e.g., 280). The connection layer may be positioned over the black member.

The connection layer may be positioned between the black member and an end portion of the first changeable layer.

The display device may include a fourth electrode (e.g., 260a). The fourth electrode may be electrically connected to the first electrode. The first changeable layer (e.g., a portion of 270 positioned over 230a) may be positioned between the second electrode (e.g., 240) and the fourth electrode. The second electrode may be positioned between the first electrode (e.g., 230*a*) and the first changeable layer.

The first changeable layer may directly contact each of the second electrode and the fourth electrode.

The display device may include a fifth electrode (e.g., 260*b*). The fifth electrode which may be electrically connected to the third electrode. The second changeable layer may be positioned between the second electrode and the fifth electrode. A recess of the connection layer (e.g., a recess of a portion of 270 positioned over 280) may be positioned between the fourth electrode and the fifth electrode.

The display device may include a third electrode (e.g., 360). The third electrode may be electrically connected to the second electrode. The first changeable layer may be positioned between the first electrode and the third electrode. The first electrode may be positioned between the second electrode and the first changeable layer.

The display device may include a second transistor (e.g., 320*b*), a fourth electrode (e.g., 330*b*), a fifth electrode (e.g., 340*b*), a second intermediate layer (e.g., 351*b*), and a second changeable layer (e.g., 370*b*). No intervening transistor may be positioned between the first transistor and the second transistor. The fourth electrode may be electrically connected to the second transistor. The fifth electrode may overlap the fourth electrode, may be spaced from the second electrode, and may be electrically connected to the third electrode (e.g., 360). The second intermediate layer may be positioned between the fourth electrode and the fifth electrode and may emit second light when the fourth electrode and the fifth electrode generate a second electric field. The second changeable layer may be positioned between the fourth electrode and the third electrode, may have the first transmittance value when the fourth electrode and the fifth electrode generate the second electric field, and may have the second transmittance value when the fourth electrode and the fifth electrode do not generate the second electric field.

A portion of the third electrode (e.g., 360) may be positioned between the first changeable layer and the second changeable layer and may directly contact each of the first changeable layer and the second changeable layer.

A recess of the third electrode (e.g., a recess of 360) may be positioned between the first changeable layer and the second changeable layer.

According to example embodiments, in a display device, e.g., an OLED device, changeable layers (or external light reflection preventing layers) may change between being transparent and being opaque, may be transparent for transmitting light when corresponding light emitting layers emit light, and may be opaque for blocking reflected light when corresponding light emitting layers do not emit light. Advantageously, undesirable reflection of external light may be reduced or substantially prevented. According to embodiment, a display device may include no additional polarizing film for handling light reflection. Advantageously, the thickness of the display device may be minimized.

BRIEF DESCRIPTION OF THE DRAWINGS

FIG. 5A, FIG. 5B, and FIG. 5C are cross-sectional views for illustrating a method of manufacturing a display device in accordance with example embodiments.

FIG. 7A, FIG. 7B, FIG. 7C, FIG. 7D, and FIG. 7E are cross-sectional views for illustrating a method of manufacturing the display device in accordance with example embodiments.

DETAILED DESCRIPTION OF EMBODIMENTS

Embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. A noun appears in singular form may mean to be a plural noun. The term "the same as" may mean "equal to" or "identical to". The term "external light reflection preventing layer" may mean "changeable layer".

Figure 1:
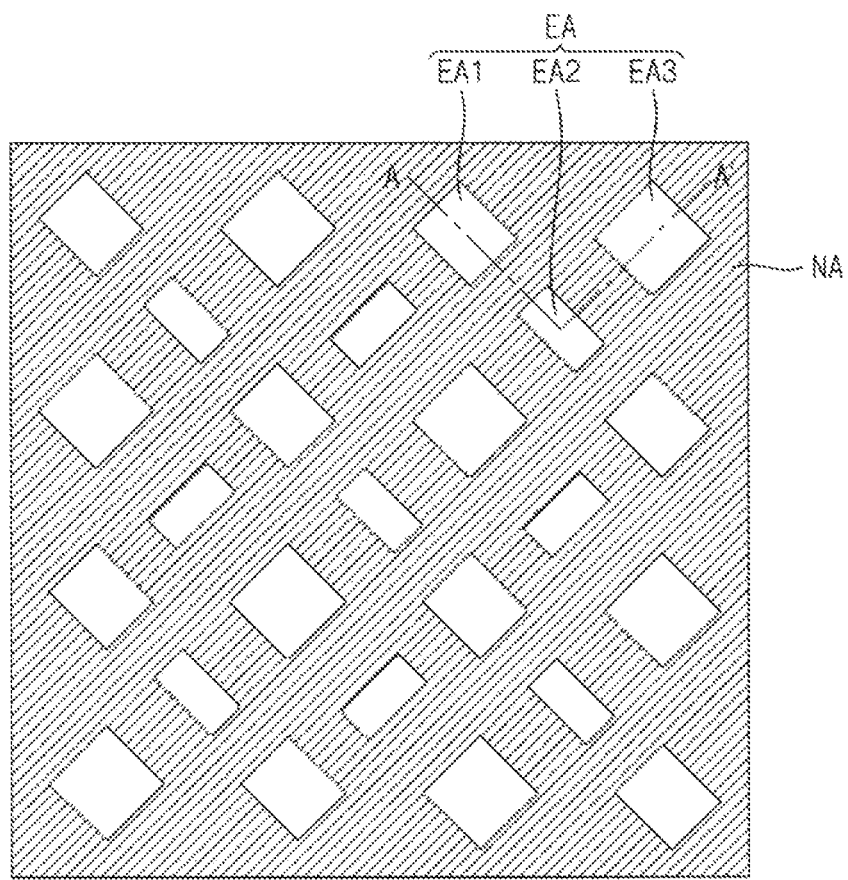
FIG. 1 is a plan view illustrating a display device, e.g., an organic light emitting display (OLED) device, in accordance with example embodiments.

FIG. 1 is a plan view illustrating a display device, e.g., an OLED device, in accordance with example embodiments.

Referring to FIG. 1, a display device 1, e.g., an OLED device 1, in accordance with example embodiments may include an emission area EA and a non-emission area NA. The emission area EA may include a first emission area EA1, a second emission area EA2, and a third emission area EA3 which emit lights different from each other. For example, the first to third emission areas EA1, EA2 and EA3 may emit red light, green light, and blue light, respectively. However, the present disclosure is not limited thereto. FIG. 1 illustrates that the first to third emission areas EA1, EA2 and EA3 have sizes different from each other. However, the present disclosure is not limited thereto, and the first to third emission areas EA1, EA2 and EA3 may have substantially the same sizes. The non-emission area NA may surround the emission area EA.

Figure 2:
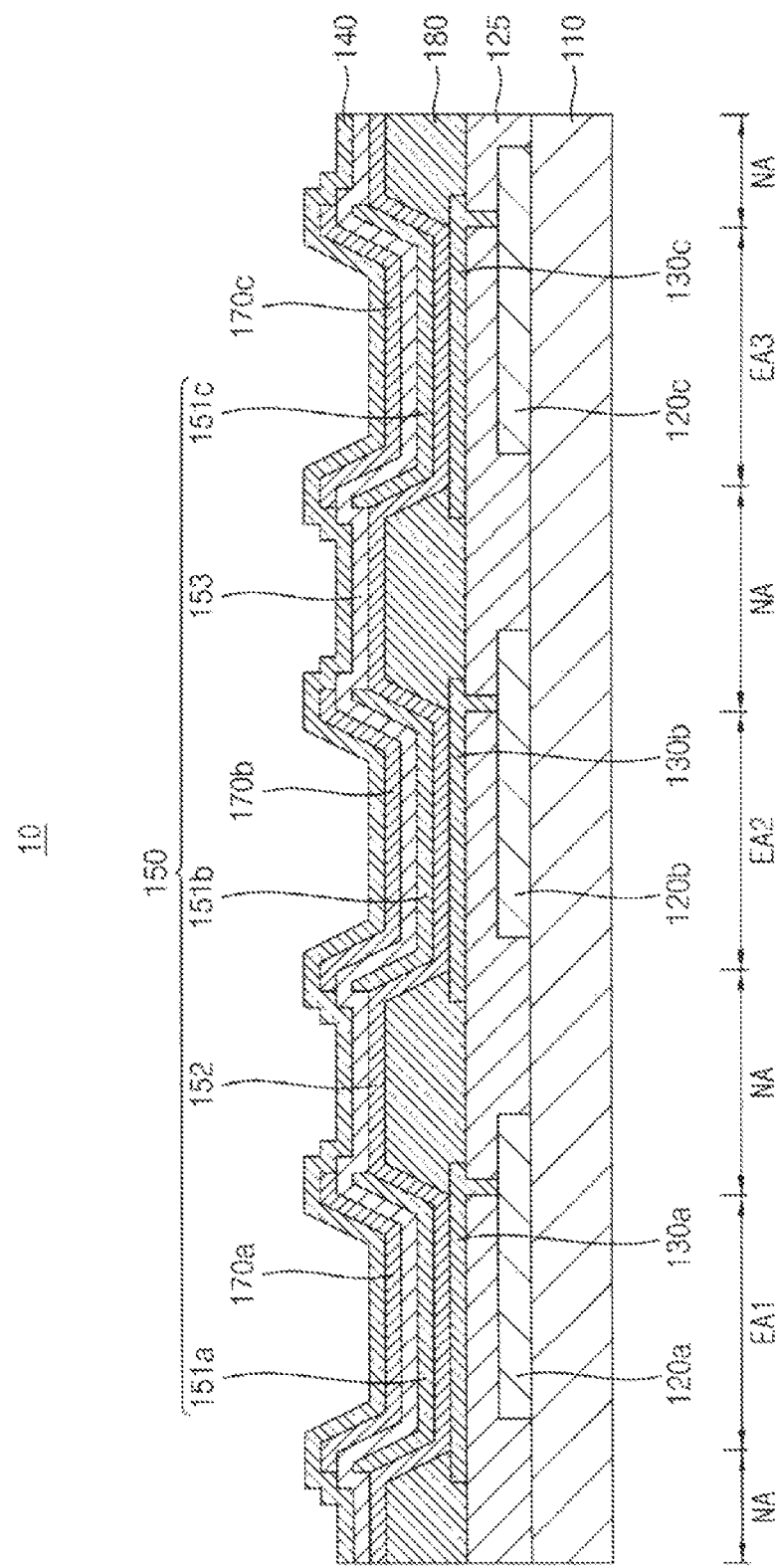
FIG. 2 is a cross-sectional view of a display device taken along a line analogous to the line A-A' in FIG. 1 in accordance with example embodiments.

FIG. 2 is a cross-sectional view of a display device, e.g., an OLED device, taken along a line analogous to the line A-A' in FIG. 1 in accordance with example embodiments.

Referring to FIG. 2, a display device 10, e.g., an OLED device 10, in accordance with an embodiment may include a substrate 110, transistors 120*a*, 120*b* and 120*c* disposed on the substrate 110, first electrodes 130*a*, 130*b* and 130*c* disposed in the emission areas EA1, EA2 and EA3, a second electrode 140 disposed in the emission areas EA1, EA2 and EA3 and the non-emission area NA, an intermediate layer 150 disposed between the second electrode 140 and each of the first electrodes 130*a*, 130*b* and 130*c*, and external light reflection preventing layers (or changeable layers) 170*a*, 170b and 170c disposed between the second electrode 140 and the corresponding first electrodes 130a, 130b and 130c. The first electrodes 130a, 130b and 130c may be electrically connected to the transistors 120a, 120b and 120c, respectively. The second electrode 140 may be opposite the first electrodes 130a, 130b and 130c, and may form/generate one or more (e.g., up to three) first electric fields with the first electrodes 130a, 130b and 130c. The intermediate layer 150 may include organic light emitting layers 151a, 151b and 151c emitting one or more sets of (e.g., up to three sets of) light based on the first electric field(s). A state of each of the external light reflection preventing layers 170a, 170b and 170c may be reversibly changed/changeable between a transparent state and an opaque state.

The substrate 110 may be a transparent and insulating substrate such as a glass substrate and a plastic substrate. For example, the substrate 110 may include thermostable and durable plastic such as polyimide, polyethylene terephthalate (PET), polycarbonate, polyethylene naphtalate, polyarylate (PAR), and polyetherimide.

The transistor 120a, 120b and 120c may be disposed on the substrate 110. An insulation layer 125 may be disposed on the substrate 110 to cover the transistor 120a, 120b and 120c. The transistor 120a, 120b and 120c may be electrically connected to the first electrode 130a, 130b and 130c to supply a driving current to the first electrode 130a, 130b and 130c. For example, a drain electrode (not illustrated) of the transistor 120a, 120b and 120c may be in contact with the first electrode 130a, 130b and 130c.

The first electrode 130a, 130b and 130c may be disposed on the insulation layer 125. The first electrode 130a, 130b and 130c may be disposed in the emission area EA1, EA2 and EA3. The first electrode 130a, 130b and 130c may be electrically connected to the transistor 120a, 120b and 120c.

The first electrode 130a, 130b and 130c may be a reflective electrode including a reflective layer. For example, the reflective layer may include silver (Ag), magnesium (Mg), aluminum (Al), platinum (Pt), palladium (Pd), gold (Au), nickel (Ni), neodymium (Nd), iridium (Ir), and/or chrome (Cr). A transparent or translucent electrode layer including indium tin oxide (ITO), indium zinc oxide (IZO), zinc oxide (ZnO), indium oxide ($In_2O_3$), indium gallium oxide (IGO), and/or aluminum zinc oxide (AZO) may be further disposed on the reflective layer. For example, the first electrode 130a, 130b and 130c may be composed of 3 layers of ITO/Ag/ITO, however, the composition of the first electrode 130a, 130b and 130c is not limited thereto.

A pixel defining layer 180 covering an edge portion of the first electrode 130a, 130b and 130c may be disposed on the insulation layer 125. The pixel defining layer 180 may define the emission area EA1, EA2 and EA3.

In example embodiments, the pixel defining layer 180 may include a black material and/or may be a black member. For example, the black material may include carbon black, phenylene black, aniline black, cyanine black, nigrosine acid black, black pigment, mixed pigment, and/or a black resin. The mixed pigment may be a mixture of pigments having different colors from each other to form black color. For example, the mixed pigment may be formed by mixing red, green, and blue pigments. The pixel defining layer 180 may include the black material, so that the pixel defining layer 180 may reduce or effectively prevent reflection of external light incident into the non-emission area NA.

The second electrode 140 may be disposed over the first electrode 130a, 130b and 130c to be opposite the first electrode 130a, 130b and 130c. The second electrode 140 may be commonly disposed from the emission area EA1, EA2 and EA3 to the non-emission area NA. The second electrode 140 may form the first electric field with the first electrode 130a, 130b and 130c.

The second electrode 140 may be a translucent electrode that transmits some rays of light and reflects the other rays of light. For example, the second electrode 140 may include a material such as silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg and/or CaAg. The material may be used to form a thin film having a thickness of few to several nanometers, so that the thin film may have a certain degree of light transmittance.

The intermediate layer 150 including the organic light emitting layer 151a, 151b and 151c may be disposed between the first electrode 130a, 130b and 130c, and the second electrode 140. The organic light emitting layer 151a, 151b and 151c may be disposed in the emission area EA1, EA2 and EA3. The organic light emitting layer 151a, 151b and 151c may include a first organic light emitting layer 151a, a second organic light emitting layer 151b, and a third organic light emitting layer 151c. The first to third organic light emitting layers 151a, 151b and 151c may correspond to a red emission layer, a green emission layer, and a blue emission layer, respectively. The organic light emitting layer 151a, 151b and 151c may emit light based on the first electric field formed between the first electrode 130a, 130b and 130c, and the second electrode 140.

In example embodiments, the intermediate layer 150 may further include a first functional layer 152 and a second functional layer 153. The first functional layer 152 may be disposed between each of the first electrode 130a, 130b and 130c and the corresponding on of the organic light emitting layer 151a, 151b and 151c. The second functional layer 153 may be disposed between the organic light emitting layer 151a, 151b and 151c, and the second electrode 140. For example, when the first electrode 130a, 130b and 130c is an anode and the second electrode 140 is a cathode, the first functional layer 152 may include at least one of a hole injection layer (HIL) and a hole transport layer (HTL), and the second functional layer 153 may include at least one of an electron injection layer (EIL) and an electron transport layer (ETL). The first and second functional layers 152 and 153 may be commonly disposed from the emission area EA1, EA2 and EA3 to the non-emission area NA.

Each of the external light reflection preventing layers 170a, 170b and 170c may be disposed between the second electrode 140 and a corresponding one of the first electrodes 130a, 130b and 130c. A state of each of the external light reflection preventing layers 170a, 170b and 170c may be reversibly changed/changeable between the transparent state and the opaque state. The external light reflection preventing layers 170a, 170b and 170c may be in identical states or in different states according to whether electric fields are generated at corresponding electrode pairs. In example embodiments, the external light reflection preventing layers 170a, 170b and 170c may be disposed in the emission areas EA1, EA2 and EA3. In embodiments, the external light reflection preventing layers 170a, 170b and 170c may be disposed between the second functional layer 153 and the second electrode 140 and may directly contact the second functional layer 153 and the second electrode 140. For example, light transmittance of each of the external light reflection preventing layers 170a, 170b and 170c may be greater than or equal to 90% when the layer is in the transparent state and may be less than or equal to 10% when the layer is in the opaque state.

In example embodiments, one or more of the external light reflection preventing layers 170a, 170b and 170c may include an electrochromic element for becoming colorless or black. In embodiments, the electrochromic element may include a polymer compound containing a functional group. For example, the functional group may include perfluorocyclobutan, a hydroxyl group, an amino group, an alkyl amino group, an aryl amino group, a heteroaryl amino group, a cyano group, an alkyl group, a cycloalkyl group, an alkoxy group, an aryl group, an aryl alkyl group, a heteroaryl group, and/or a heterocyclic group.

In example embodiments, the state of each of the external light reflection preventing layers 170a, 170b and 170c may be changed based on the first electric field formed/generated between the second electrode 140 and the corresponding one of the first electrodes 130a, 130b and 130c, similar to and/or consistent with an operation of the corresponding one of the organic light emitting layers 151a, 151b and 151c. For example, when a first electric field is formed between the second electrode 140 and one of the first electrode 130a, 130b and 130c, the corresponding one of the organic light emitting layers 151a, 151b and 151c may emit light, and the corresponding one of the external light reflection preventing layers 170a, 170b and 170c may become transparent. In embodiments, when the first electric field is not formed between the second electrode 140 and one of the first electrodes 130a, 130b and 130c, the corresponding one of the organic light emitting layers 151a, 151b and 151c may not emit light, and the corresponding one of the external light reflection preventing layers 170a, 170b and 170c may become opaque. Thus, when a first electric field is formed, light emitted from the corresponding one of the organic light emitting layers 151a, 151b and 151c may pass through the corresponding one of the external light reflection preventing layers 170a, 170b and 170c in the transparent state with relatively high light transmittance, so that the OLED device 10 may display an image. In embodiments, when the first electric field is not formed in an electrode pair, external light incident into one or more of the emission areas EA1, EA2 and EA3 may be absorbed by the no-electric-field one of the external light reflection preventing layers 170a, 170b and 170c in the opaque state with relatively low light transmittance, so that undesirable reflection of external light may be reduced or substantially prevented. The external light reflection preventing layers 170a, 170b and 170c, of which states are reversibly changeable between the transparent state and the opaque state, may be disposed in the emission area EA1, EA2 and EA3, so that the external light reflection preventing layers 170a, 170b and 170c may selectively prevent undesirable reflection of external light at the emission areas EA1, EA2 and EA3.

An encapsulation member (not illustrated) may be disposed on the second electrode 140. In example embodiments, the encapsulation member may be a transparent and insulating substrate such as a glass substrate and a plastic substrate, similar to the substrate 110. In some example embodiments, the encapsulation member may be a thin film encapsulation layer. The thin film encapsulation layer may include at least one inorganic layer and at least one organic layer. The inorganic layer may be formed of metal oxide, metal nitride, metal carbide, or a mixture thereof. For example, the inorganic layer may be formed of aluminum oxide, silicon oxide, or silicon nitride. The inorganic layer may reduce or effectively prevent the permeation of moisture and/or oxygen into the OLED device 10. The organic layer may be a polymer organic compound, and may be formed of epoxy, acrylate and/or urethane acrylate. The organic layer may alleviate an inner stress of the inorganic layer, may supplement defect of the inorganic layer.

The OLED device 10 in accordance with an embodiment may include the external light reflection preventing layers 170a, 170b and 170c selectively and substantially preventing undesirable reflection of external light at the emission areas EA1, EA2 and EA3. The pixel defining layer 180 may substantially prevent undesirable reflection of external light at the non-emission area NA. Therefore, undesirable reflection of external light at the emission areas EA1, EA2 and EA3 and the non-emission area NA may be reduced or substantially prevented. Accordingly, the OLED device 10 may display images with satisfactory visibility without requiring a circular polarizing plate.

FIGS. 3A, 3B, 3C, and 3D are cross-sectional views for illustrating a method of manufacturing the display device illustrated in FIG. 2 in accordance with example embodiments.

Figure 3A:
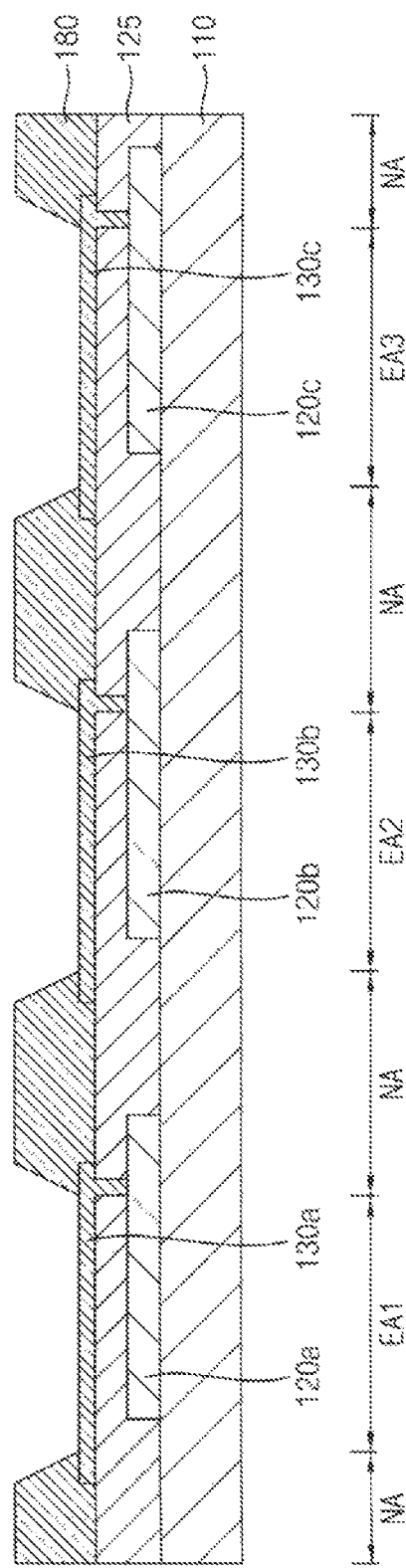
FIG. 3A, FIG. 3B, FIG. 3C, and FIG. 3D are cross-sectional views for illustrating a method of manufacturing a display device in accordance with example embodiments.

Referring to FIG. 3A, the transistor 120a, 120b and 120c may be formed on the substrate 110, and the insulation layer 125 may be formed on the substrate 110 to cover the transistor 120a, 120b and 120c. An opening may be formed in the insulation layer 125 to expose a portion of the transistor 120a, 120b and 120c. The first electrode 130a, 130b and 130c may be formed on the insulation layer 125, and may fill the opening. In embodiments, the drain electrode of the transistor 120a, 120b and 120c may be exposed by the opening, and the first electrode 130a, 130b and 130c may be formed in the emission area EA1, EA2 and EA3 as an island shape. The pixel defining layer 180 covering the edge portion of the first electrode 130a, 130b and 130c may be formed on the insulation layer 125. The pixel defining layer 180 may expose a center portion of the first electrode 130a, 130b and 130c to define the emission area EA1, EA2 and EA3. In example embodiments, the pixel defining layer 180 may include a black material, and the black material may include carbon black, phenylene black, aniline black, cyanine black, nigrosine acid black, black pigment, mixed pigment, and/or a black resin. The mixed pigment may be a mixture of pigments having different colors from each other to form black color. For example, the mixed pigment may be formed by mixing red, green, and blue pigments.

Figure 3B:
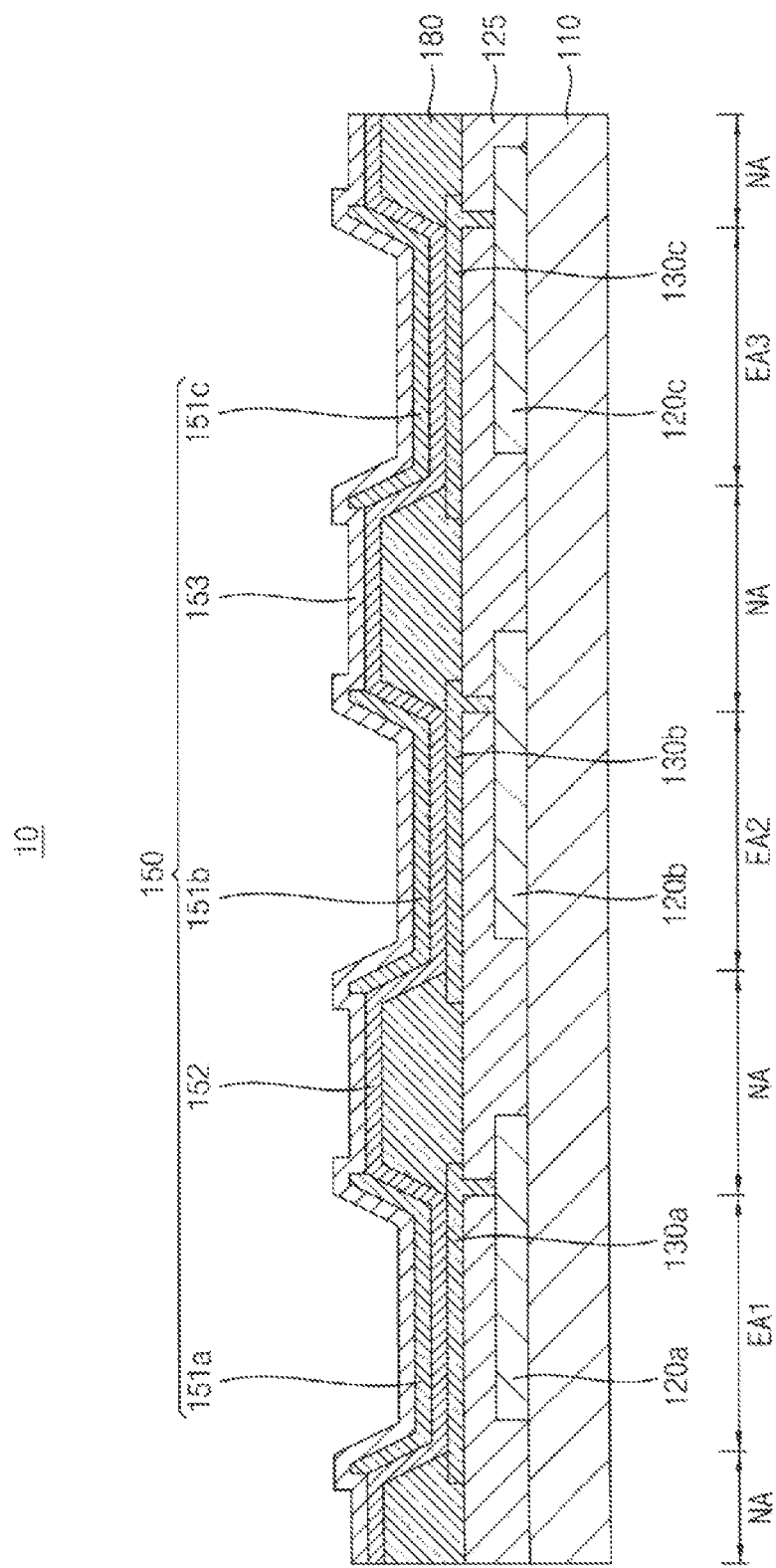

Referring to FIG. 3B, the intermediate layer 150 including the organic light emitting layer 151a, 151b and 151c may be formed on the exposed first electrode 130a, 130b and 130c, and the pixel defining layer 180. In example embodiments, the first functional layer 152 may be formed commonly from the emission area EA1, EA2 and EA3 to the non-emission area NA on the exposed first electrode 130a, 130b and 130c, and the pixel defining layer 180, the organic light emitting layer 151a, 151b and 151c may be formed in the emission area EA1, EA2 and EA3 on the first functional layer 152, and the second functional layer 153 may be formed commonly from the emission area EA1, EA2 and EA3 to the non-emission area NA on the first functional layer 152 to cover the organic light emitting layer 151a, 151b and 151c. For example, the organic light emitting layer 151a, 151b and 151c may be formed in the emission area EA1, EA2 and EA3 by using a printing process, a spin coating process, a thermal transfer method using a laser, a vacuum deposition method, etc.

Figure 3C:
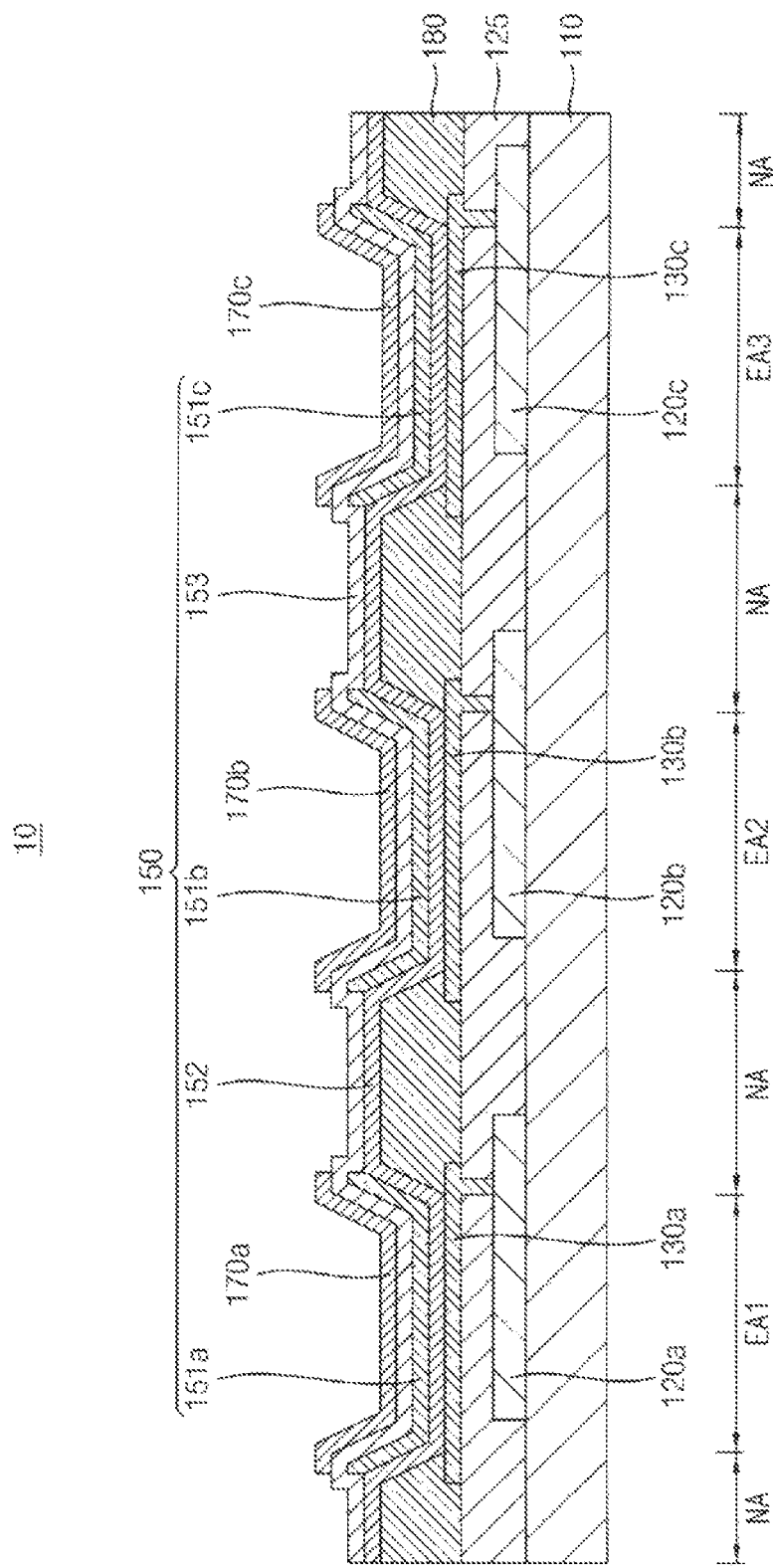

Referring to FIG. 3C, the external light reflection preventing layer 170a, 170b and 170c may be formed on the intermediate layer 150. In example embodiments, the external light reflection preventing layer 170a, 170b and 170c may be formed in the emission area EA1, EA2 and EA3. For example, the external light reflection preventing layer 170a, 170b and 170c may be formed in the emission area EA1, EA2 and EA3 by using such as a printing process. In example embodiments, the external light reflection preventing layer 170a, 170b and 170c may include an electrochromic element becoming colorless or black, and the electrochromic element may include a polymer compound containing a functional group. For example, the functional group may include perfluorocyclobutan, a hydroxyl group, an amino group, an alkyl amino group, an aryl amino group, a heteroaryl amino group, a cyano group, an alkyl group, a cycloalkyl group, an alkoxy group, an aryl group, an aryl alkyl group, a heteroaryl group, and/or a heterocyclic group.

Figure 3D:
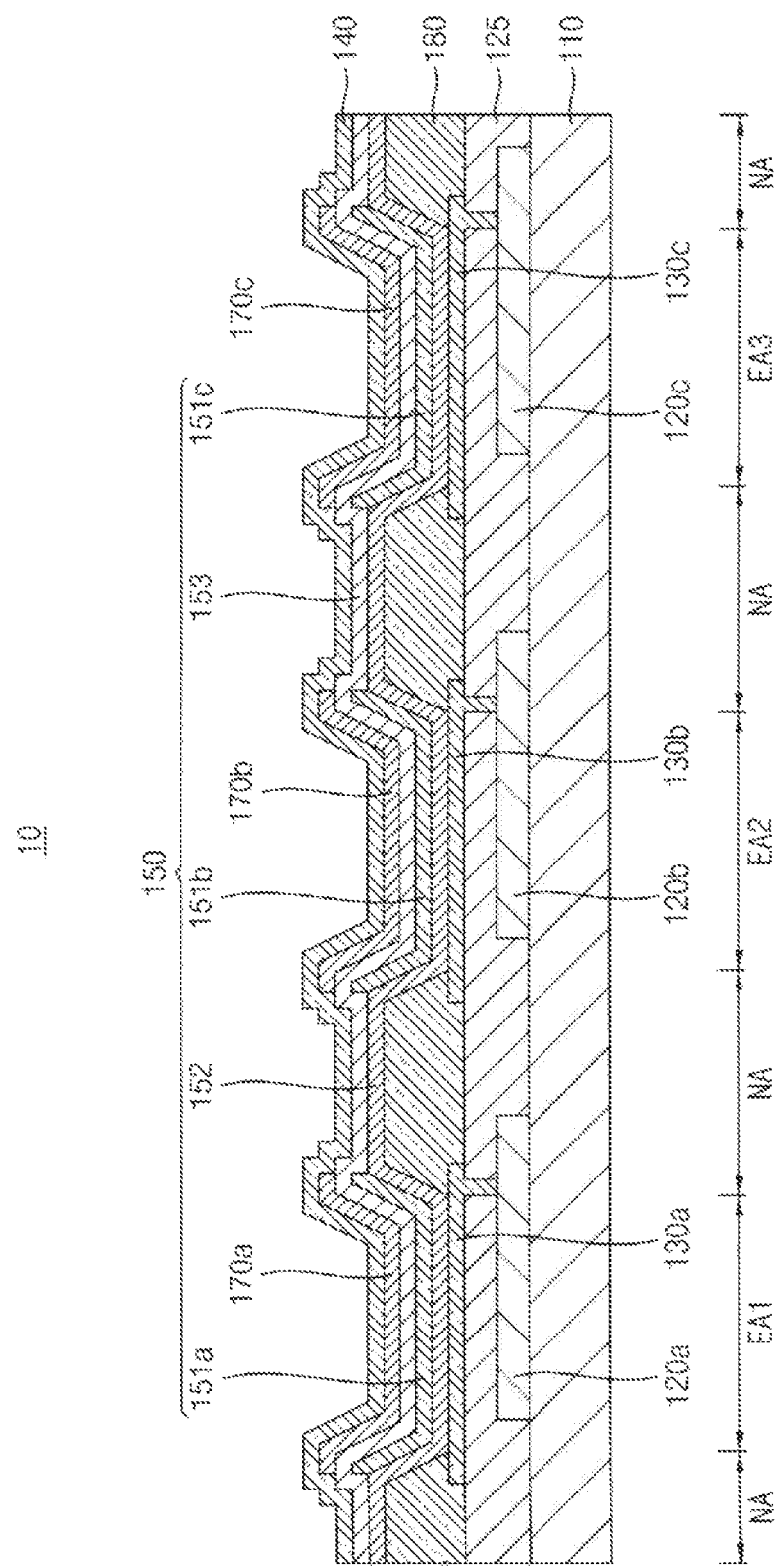

Referring to FIG. 3D, the second electrode 140 may be formed on the intermediate layer 150 to cover the external light reflection preventing layer 170a, 170b and 170c. The second electrode 140 may be commonly formed from the emission area EA1, EA2 and EA3 to the non-emission area NA.

Figure 4:
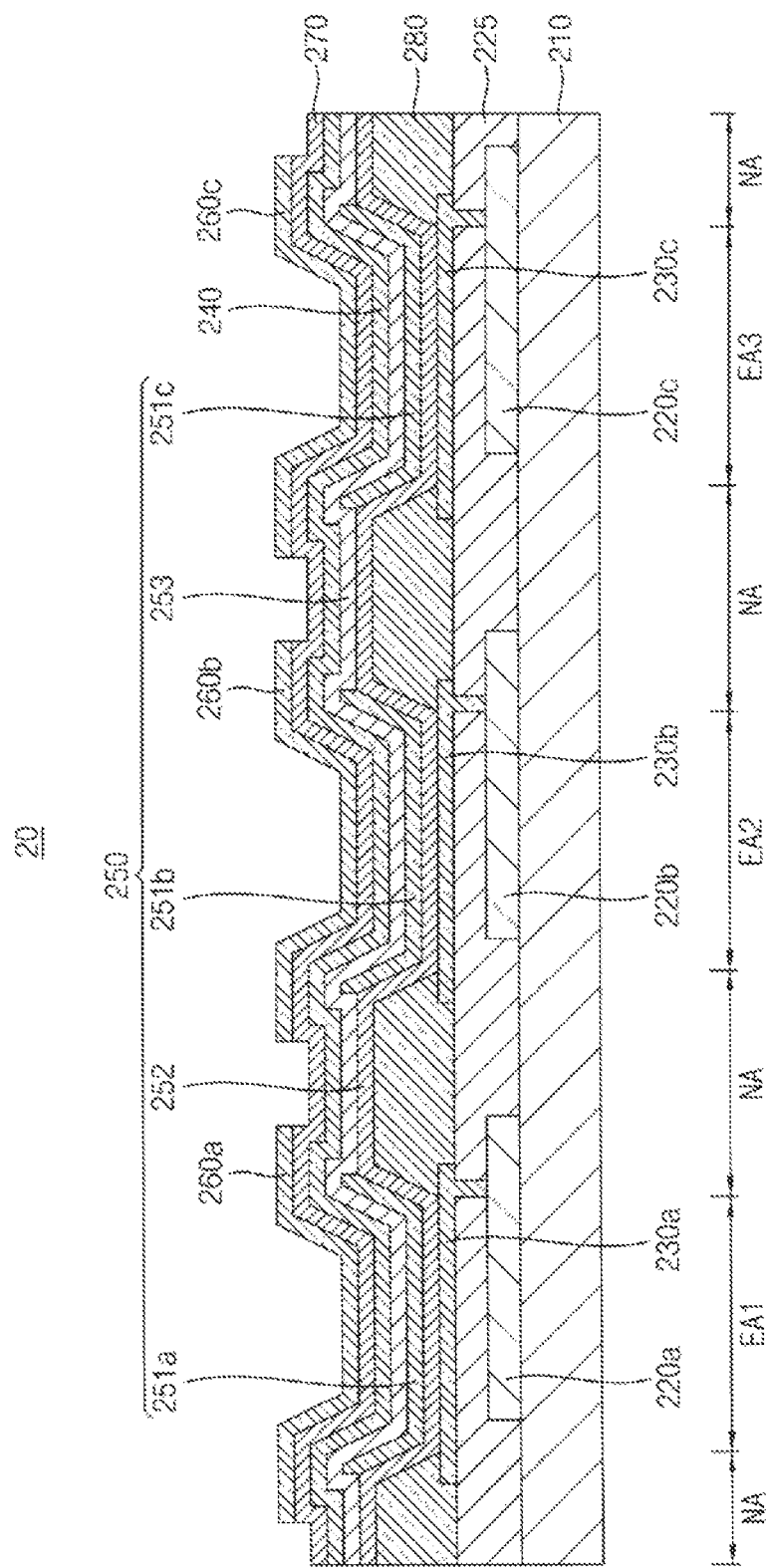
FIG. 4 is a cross-sectional view of a display device taken along a line analogous to the line A-A' in FIG. 1 in accordance with example embodiments.

FIG. 4 is a cross-sectional view of a display device, e.g., an OLED device, taken along a line analogous to the line A-A' in FIG. 1 in accordance with example embodiments.

Referring to FIG. 4, a display device 20, e.g., an OLED device 20, in accordance with an embodiment may include a substrate 210, transistors 220a, 220b and 220c disposed on the substrate 210, first electrodes 230a, 230b and 230c disposed in the emission areas EA1, EA2 and EA3, a second electrode 240 disposed in the emission areas EA1, EA2 and EA3 and the non-emission area NA over the first electrodes 230a, 230b and 230c, an intermediate layer 250 disposed between the second electrode 240 and each of the first electrodes 230a, 230b and 230c, third electrodes 260a, 260b and 260c disposed over the second electrode 240, and an external light reflection preventing layer 270 (or changeable layer 270) with portions being disposed between the second electrode 240 and the third electrodes 260a, 260b and 260c. The first electrodes 230a, 230b and 230c may be electrically connected to the transistors 220a, 220b and 220c, respectively. The second electrode 240 may be opposite the first electrodes 230a, 230b and 230c, and may form/generate one or more first electric fields with one or more of the first electrodes 230a, 230b and 230c. The intermediate layer 250 may include organic light emitting layers 251a, 251b and 251c emitting one or more lights based on one or more of the first electric fields. The third electrodes 260a, 260b and 260c may be opposite the second electrode 240, and may form/generate one or more second electric fields with the second electrode 240. Each portion of the layer 270 may have a transparent state and an opaque state. A state of a portion the external light reflection preventing layer 270 may be reversibly changed/changeable between a transparent state and an opaque state based on the second electric field.

In describing the OLED device 20 in accordance with an embodiment with reference to FIG. 4, detailed descriptions of elements of the OLED device 20, which are substantially the same as or similar to that of the OLED device 10 in accordance with an embodiment with reference to FIG. 2, may be not repeated.

The third electrodes 260a, 260b and 260c may be disposed over the second electrode 240. In example embodiments, the third electrodes 260a, 260b and 260c may be disposed in the emission areas EA1, EA2 and EA3. The third electrode 260a, 260b and 260c may form/generate one or more second electric fields with the second electrode 240.

Each of the third electrodes 260a, 260b and 260c may be a translucent electrode that transmits some rays of light and reflects the other rays of light. For example, the third electrode 260a, 260b and 260c may include a material such as silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg and/or CaAg. The material may be used to form a thin film having a thickness of few to several nanometers, so that the thin film may have a certain degree of light transmittance.

Portions of the external light reflection preventing layer 270 may be disposed between the second electrode 240 and the third electrodes 260a, 260b and 260c. The state of a portion of the external light reflection preventing layer 270 may be reversibly changed/changeable between the transparent state and the opaque state. In example embodiments, the external light reflection preventing layer 270 may extend from the emission area EA1, EA2 and EA3 to the non-emission area NA. In embodiments, light transmittance of the external light reflection preventing layer 270 may be about 90% or more in the transparent state and about 10% or less in the opaque state.

In example embodiments, states of portions of the external light reflection preventing layer 270 may be changed based on the second electric fields formed between the second electrode 240 and the third electrodes 260a, 260b and 260c. For example, when a second electric field is formed between the second electrode 240 and one of the third electrodes 260a, 260b and 260c, the corresponding portion of the external light reflection preventing layer 270 may become transparent. In embodiments, when no second electric field is formed between the second electrode 240 and one of the third electrodes 260a, 260b and 260c, the corresponding portion of the external light reflection preventing layer 270 may become opaque.

In example embodiments, the third electrodes 260a, 260b and 260c may be electrically connected to the first electrodes 230a, 230b and 230c, respectively, and therefore to the transistors 220a, 220b and 220c, respectively. Although it is not illustrated in FIG. 4, for example, a contact hole may be formed in the pixel defining layer 280, the intermediate layer 250, the second electrode 240 and the external light reflection preventing layer 270, which are disposed between the first electrode 230a, 230b and 230c, and the third electrode 260a, 260b and 260c. Then, an insulation member and an conductive member surrounded by the insulation member may fill the contact hole thereby electrically connecting the third electrode 260a, 260b and 260c to the first electrode 230a, 230b and 230c. In embodiments, the second electric field formed between the second electrode 240 and the third electrode 260a, 260b and 260c may be substantially the same as the first electric field formed between the first electrode 230a, 230b and 230c and the second electrode 240.

Therefore, when first electric fields are formed/generated for some of the emission areas, second electric fields substantially equal to the first electric fields may be formed/generated, and light emitted from the emitting ones of the organic light emitting layers 251a, 251b and 251c may pass through the corresponding portions of the external light reflection preventing layer 270 in the transparent state with relatively high light transmittance, so that the OLED device 20 may display an image. In embodiments, when no first electric fields are formed in some emission areas, no second electric fields may be formed the no-first-electric-field areas, and external light incident into the emission area EA1, EA2 and EA3 may be absorbed by the corresponding portions of the external light reflection preventing layer 270 in the opaque state with relatively low light transmittance in the non-emitting areas, so that undesirable reflection of external light may be reduced or substantially prevented. Portions of the external light reflection preventing layer 270 may individually change between the transparent state and the opaque state, may be disposed in the emission areas EA1, EA2 and EA3, so that the external light reflection preventing layer 270 may selectively prevent reflection of external light at the emission area EA1, EA2 and EA3.

The OLED device 20 in accordance with an embodiment may include the external light reflection preventing layer 270 selectively preventing the reflection of the external light incident into the emission area EA1, EA2 and EA3, and the pixel defining layer 280 preventing the reflection of the external light incident into the non-emission area NA, so that the reflection of the external light incident into the emission area EA1, EA2 and EA3, and the non-emission area NA may be reduced or effectively prevented. Accordingly, the OLED device 20 may reduce or effectively prevent the reflection of the external light without a circular polarizing plate having a relatively thick thickness.

Figure 5B:
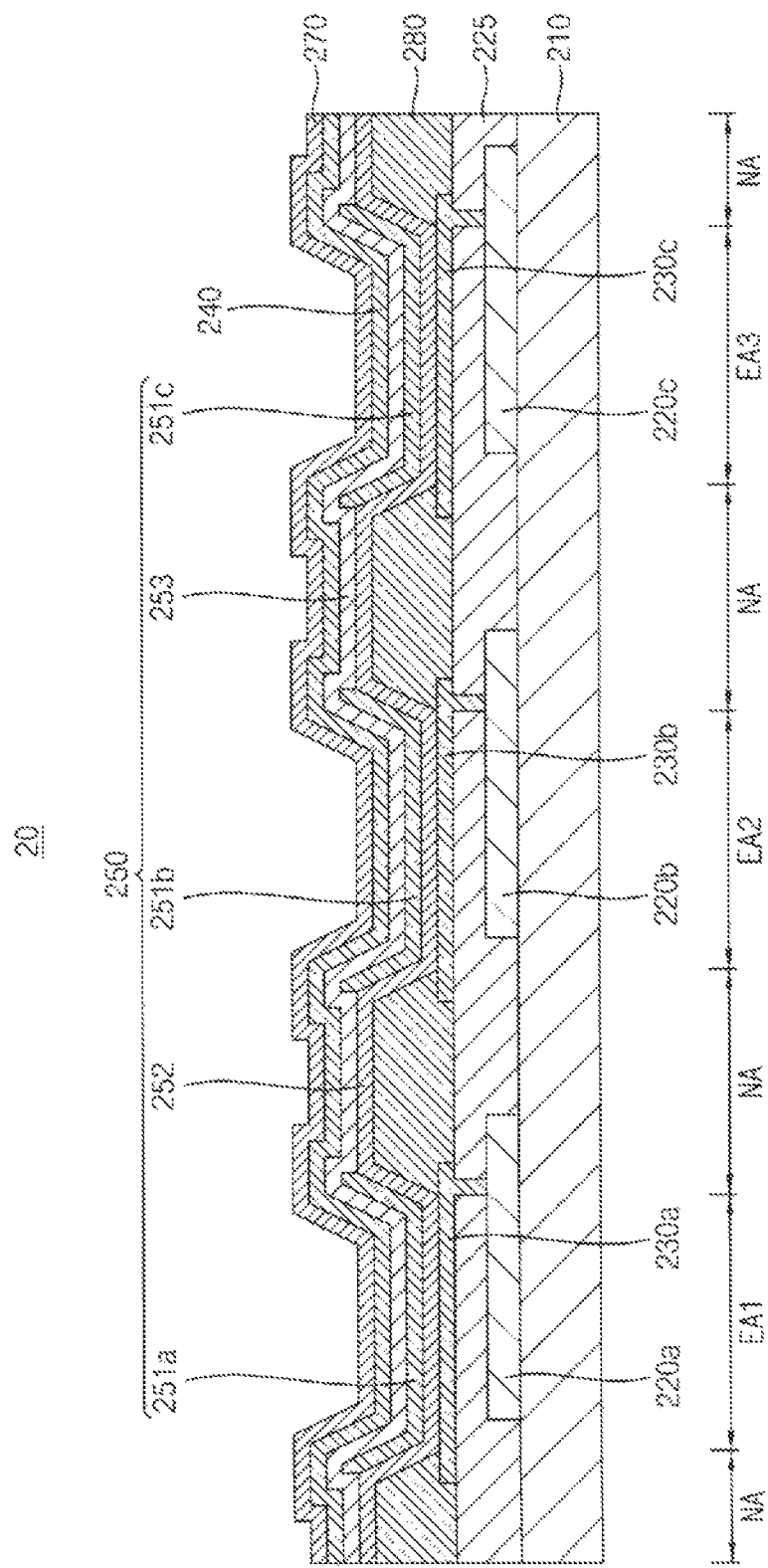
Figure 5C:
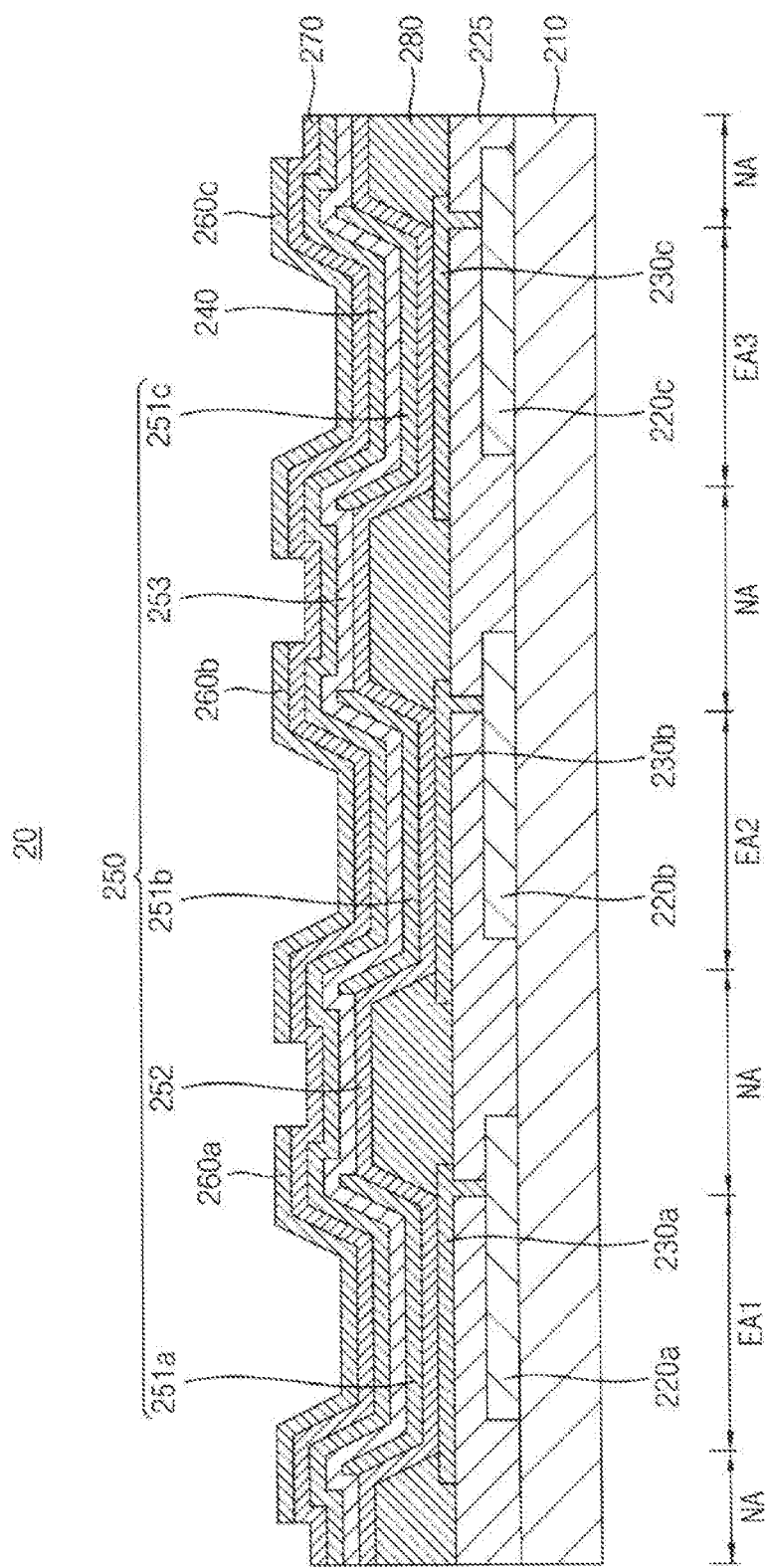

FIGS. 5A, 5B, and 5C are cross-sectional views for illustrating a method of manufacturing the display device in FIG. 4 in accordance with example embodiments.

In describing a method of manufacturing the OLED device 20 in accordance with an embodiment with reference to FIGS. 5A to 5C, detailed descriptions of elements of the method of manufacturing the OLED device 20, which are substantially the same as or similar to that of the OLED device 10 in accordance with an embodiment with reference to FIGS. 3A to 3D, may be not repeated.

Referring to FIG. 5A, the second electrode 240 may be formed on the intermediate layer 250. The second electrode 240 may be formed commonly from the emission area EA1, EA2 and EA3 to non-emission area NA.

Referring to FIG. 5B, the external light reflection preventing layer 270 may be formed on the second electrode 240. In example embodiments, the external light reflection preventing layer 270 may be formed commonly from the emission area EA1, EA2 and EA3 to non-emission area NA.

Referring to FIG. 5C, the third electrode 260a, 260b and 260c may be formed on the external light reflection preventing layer 270. The third electrode 260a, 260b and 260c may be formed in the emission area EA1, EA2 and EA3.

Figure 6:
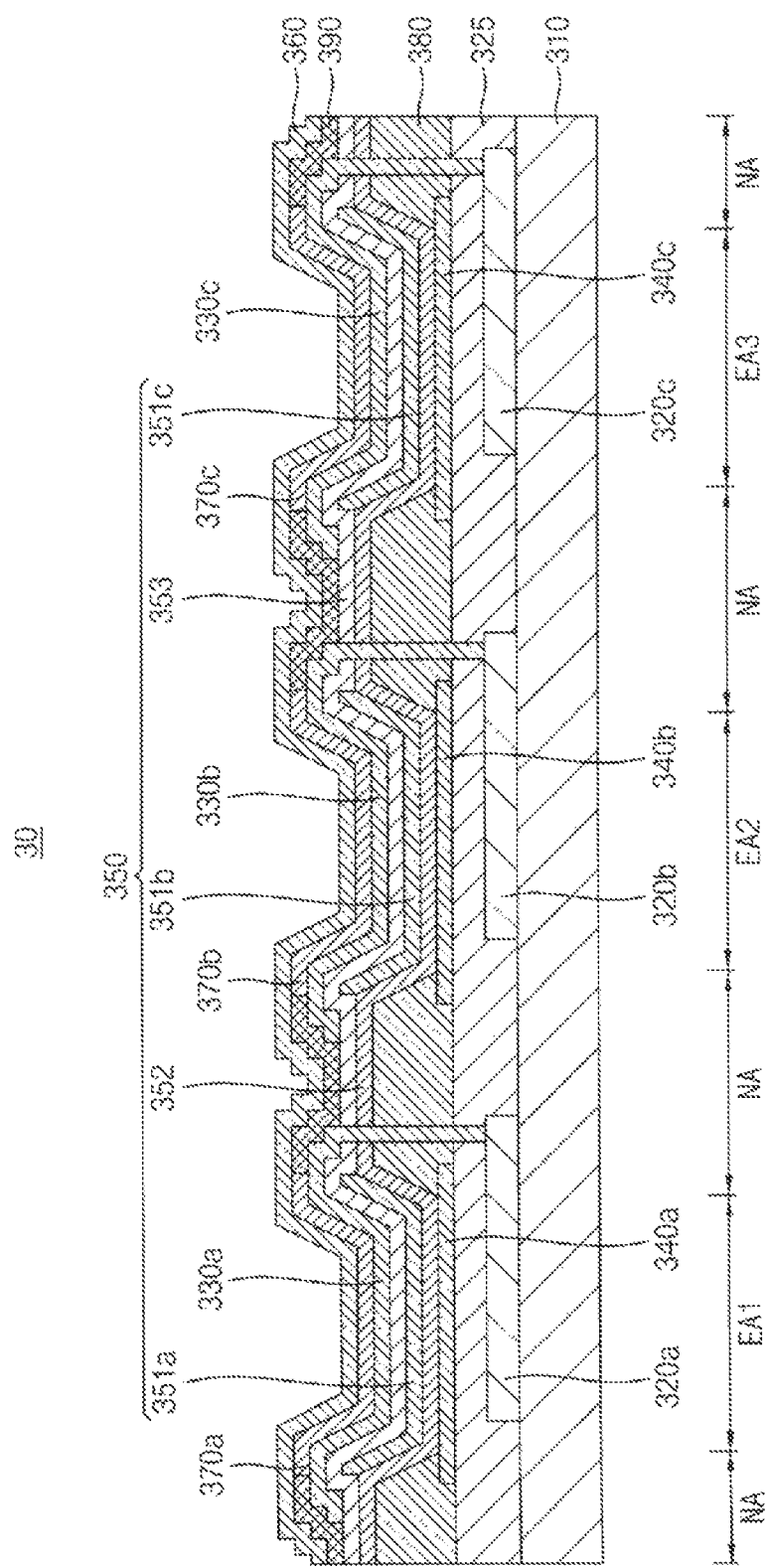
FIG. 6 is a cross-sectional view of a display device taken along a line analogous to the line A-A' in FIG. 1 in accordance with example embodiments.

FIG. 6 is a cross-sectional view of a display device, e.g., an OLED device, taken along a line analogous to the line A-A' in FIG. 1 in accordance with example embodiments.

Referring to FIG. 6, an OLED device 30 in accordance with an embodiment may include a substrate 310, transistors 320a, 320b and 320c disposed on the substrate 310, first electrodes 330a, 330b and 330c disposed in the emission areas EA1, EA2 and EA3, second electrodes 340a, 340b and 340c disposed in the emission areas EA1, EA2 and EA3 under the first electrodes 330a, 330b and 330c, an intermediate layer 350 disposed between each of the first electrode 330a, 330b and 330c and the corresponding one of the second electrodes 340a, 340b and 340c, a third electrode 360 disposed over the first electrodes 330a, 330b and 330c, and external light reflection preventing layers (or changeable layers) 370a, 370b and 370c disposed between the third electrode 360 and the first electrodes 330a, 330b and 330c. The first electrodes 330a, 330b and 330c may be electrically connected to the transistor 320a, 320b and 320c, respectively. The second electrodes 340a, 340b and 340c may be opposite the first electrodes 330a, 330b and 330c, respectively, and may form/generate one or more (e.g., up to three) first electric fields with the first electrodes 330a, 330b and 330c. The intermediate layer 350 may include organic light emitting layers 351a, 351b and 351c for emitting one or more lights (e.g., up to three lights) based on the one or more first electric fields. The third electrode 360 may be opposite the first electrodes 330a, 330b and 330c, and may form/generate one or more (e.g., up to three) second electric fields with the first electrodes 330a, 330b and 330c. A state of each of the external light reflection preventing layers 370a, 370b and 370c may be reversibly changed/changeable between a transparent state and an opaque state based on a corresponding second electric field.

In describing the OLED device 30 in accordance with another embodiment with reference to FIG. 6, detailed descriptions of elements of the OLED device 30, which are substantially the same as or similar to that of the OLED device 10 in accordance with an embodiment with reference to FIG. 2 or that of the OLED device 20 in accordance with another embodiment with reference to FIG. 4, may be not repeated.

The first electrode 330a, 330b and 330c may be a translucent electrode that transmits some rays of light and reflects the other rays of light. For example, the first electrode 330a, 330b and 330c may include a material such as silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg and/or CaAg. The material may be used to form a thin film having a thickness of few to several nanometers, so that the thin film may have a certain degree of light transmittance.

The second electrode 340a, 340b and 340c opposing the first electrode 330a, 330b and 330c may be disposed under the first electrode 330a, 330b and 330c. The second electrode 340a, 340b and 340c may be disposed in the emission area EA1, EA2 and EA3. The second electrode 340a, 340b and 340c may form the first electric field with the first electrode 330a, 330b and 330c.

The second electrode 340a, 340b and 340c may be a reflective electrode including a reflective layer. For example, the reflective layer may include silver (Ag), magnesium (Mg), aluminum (Al), platinum (Pt), palladium (Pd), gold (Au), nickel (Ni), neodymium (Nd), iridium (Ir), and/or chrome (Cr). A transparent or translucent electrode layer including indium tin oxide (ITO), indium zinc oxide (IZO), zinc oxide (ZnO), indium oxide ($In_2O_3$), indium gallium oxide (IGO), and/or aluminum zinc oxide (AZO) may be further disposed on the reflective layer. For example, the second electrode 340a, 340b and 340c may be composed of 3 layers of ITO/Ag/ITO, however, the composition of the second electrode 340a, 340b and 340c is not limited thereto.

A pixel defining layer 380 covering an edge portion of the second electrode 340a, 340b and 340c may be disposed on the insulation layer 325. The pixel defining layer 380 may define the emission area EA1, EA2 and EA3.

In example embodiments, the intermediate layer 350 may further include a first functional layer 352 and a second functional layer 353. The first functional layer 352 may be disposed between the second electrode 340a, 340b and 340c, and the organic light emitting layer 351a, 351b and 351c. The second functional layer 353 may be disposed between the organic light emitting layer 351a, 351b and 351c, and the first electrode 330a, 330b and 330c. For example, when the second electrode 340a, 340b and 340c is an anode and the first electrode 330a, 330b and 330c is a cathode, the first functional layer 352 may include at least one of a hole injection layer (HIL) and a hole transport layer (HTL), and the second functional layer 353 may include at least one of an electron injection layer (EIL) and an electron transport layer (ETL). The first and second functional layers 352 and 353 may be commonly disposed from the emission area EA1, EA2 and EA3 to the non-emission area NA.

The third electrode 360 may be disposed over the first electrodes 330a, 330b and 330c. In example embodiments, the third electrode 360 may extend from the emission areas EA1, EA2 and EA3 to non-emission area NA. The third electrode 360 may form/generate one or more second electric fields with one or more of the first electrodes 330a, 330b and 330c.

The external light reflection preventing layers 370a, 370b and 370c may be disposed between the third electrode 360 and the first electrodes 330a, 330b and 330c. The state of each of the external light reflection preventing layers 370a, 370b and 370c may be reversibly changed/changeable between the transparent state and the opaque state. In example embodiments, the external light reflection preventing layers 370a, 370b and 370c may be disposed in the emission areas EA1, EA2 and EA3. In embodiments, an insulation layer 390 may be disposed in the non-emission area NA between the first electrodes 330a, 330b and 330c, and the third electrode 360 thereby insulating the third electrode 360 from the first electrode 330a, 330b and 330c. In embodiments, light transmittance of the external light reflection preventing layer 370a, 370b and 370c may be about 90% or more in the transparent state and about 10% or less in the opaque state.

In example embodiments, the state of each of the external light reflection preventing layers 370a, 370b and 370c may be changed based on the second electric field formed/generated between the third electrode 360 and the corresponding one of the first electrodes 330a, 330b and 330c. For example, when a second electric field is formed between the third electrode 360 and one of the first electrode 330a, 330b and 330c, the corresponding one of the external light reflection preventing layers 370a, 370b and 370c may become transparent. In embodiments, when no second electric field is formed between the third electrode 360 and one of the first electrode 330a, 330b and 330c, the corresponding one of the external light reflection preventing layers 370a, 370b and 370c may become opaque.

In example embodiments, the third electrode 360 may be electrically connected to each of the second electrodes 340a, 340b and 340c. Although it is not illustrated in FIG. 6, for example, wirings connected to the second electrode 340a, 340b and 340c may be in contact with the third electrode 360 at an edge portion of the OLED device 30, thereby electrically connecting the third electrode 360 to the second electrode 340a, 340b and 340c. In embodiments, the second electric field formed between the first electrode 330a, 330b and 330c, and the third electrode 360 may be substantially the same as the first electric field formed between the first electrode 330a, 330b and 330c, and the second electrode 340a, 340b and 340c.

In embodiments, when a first electric field is formed/generated in an area, a second electric field substantially equal to the first electric filed may be formed in the area, and light emitted from the corresponding one of the organic light emitting layers 351a, 351b and 351c may pass through the corresponding one of the external light reflection preventing layers 370a, 370b and 370c in the transparent state with relatively high light transmittance, so that the OLED device 30 may display an image. In embodiments, when no first electric field is formed/generated in an area, no second electric field may be formed in the area, and external light incident into the corresponding one of the emission areas EA1, EA2 and EA3 may be absorbed by the corresponding one of the external light reflection preventing layers 370a, 370b and 370c in the opaque state with relatively low light transmittance, so that undesirable reflection of external light may be reduced or substantially prevented. The external light reflection preventing layers 370a, 370b and 370c may be disposed in the emission areas EA1, EA2 and EA3, so that the external light reflection preventing layers 370a, 370b and 370c may selectively prevent reflection of external light at the emission areas EA1, EA2 and EA3.

The OLED device 30 in accordance with an embodiment may include the external light reflection preventing layers 370a, 370b and 370c selectively preventing reflection of external light at the emission area EA1, EA2 and EA3, and may include the pixel defining layer 380 preventing reflection of external light at the non-emission area NA. Accordingly, the OLED device 30 may display images with satisfactory visibility without requiring a circular polarizing plate. Advantageously, the thickness of the OLED device 30 may be minimized.

FIGS. 7A, 7B, 7C, 7D, and 7E are cross-sectional views for illustrating a method of manufacturing the OLED device in FIG. 6.

In describing a method of manufacturing the OLED device 30 in accordance with an embodiment with reference to FIGS. 7A to 7E, detailed descriptions of elements of the method of manufacturing the OLED device 30, which are substantially the same as or similar to that of the OLED device 10 in accordance with an embodiment with reference to FIGS. 3A to 3D or that of the OLED device 20 in accordance with another embodiment with reference to FIGS. 5A to 5C, may be not repeated.

Referring to FIG. 7A, the transistor 320a, 320b and 320c may be formed on the substrate 310, and the insulation layer 325 may be formed on the substrate 310 to cover the transistor 320a, 320b and 320c. The second electrode 340a, 340b and 340c may be formed on the insulation layer 325. The second electrode 340a, 340b and 340c may be formed in the emission area EA1, EA2 and EA3 as an island shape. The pixel defining layer 380 covering the edge portion of the second electrode 340a, 340b and 340c may be formed on the insulation layer 325. The pixel defining layer 380 may expose a center portion of the second electrode 340a, 340b and 340c to define the emission area EA1, EA2 and EA3.

Referring to FIG. 7B, the intermediate layer 350 including the organic light emitting layer 351a, 351b and 351c may be formed on the exposed second electrode 340a, 340b and 340c, and the pixel defining layer 380. In example embodiments, the first functional layer 352 may be formed commonly from the emission area EA1, EA2 and EA3 to the non-emission area NA on the exposed second electrode 340a, 340b and 340c, and the pixel defining layer 380, the organic light emitting layer 351a, 351b and 351c may be formed in the emission area EA1, EA2 and EA3 on the first functional layer 352, and the second functional layer 353 may be formed commonly from the emission area EA1, EA2 and EA3 to the non-emission area NA on the first functional layer 352 to cover the organic light emitting layer 351a, 351b and 351c. For example, the organic light emitting layer 351a, 351b and 351c may be formed in the emission area EA1, EA2 and EA3 by using a printing process, a spin coating process, a thermal transfer method using a laser, a vacuum deposition method, etc.

Figure 7C:
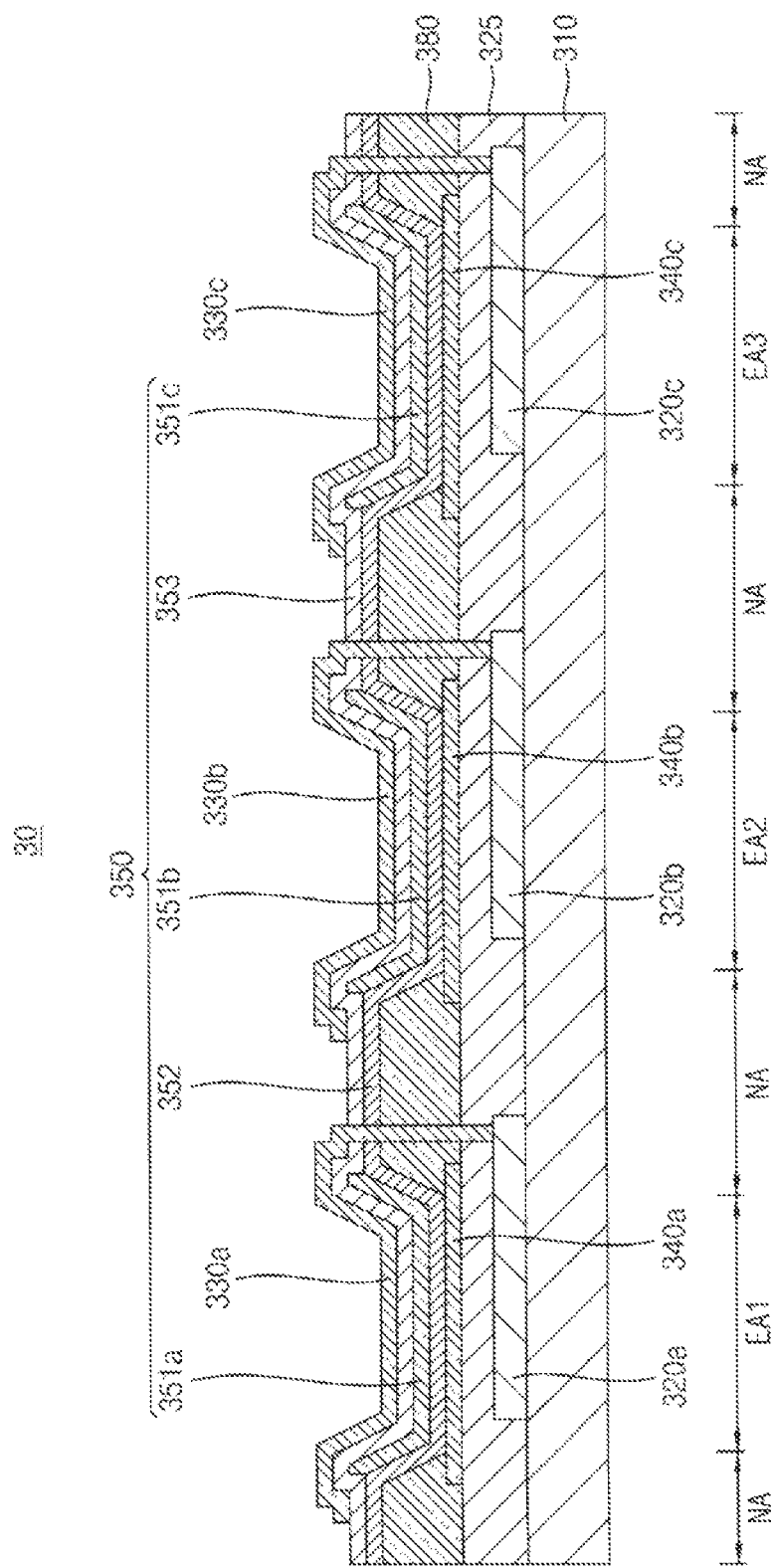

Referring to FIG. 7C, an opening may be formed in the intermediate layer 350, the pixel defining layer 380, and the insulation layer 325 to expose a portion of the transistor 320a, 320b and 320c. The first electrode 330a, 330b and 330c may be formed on the intermediate layer 350, and may fill the opening. In embodiments, the drain electrode of the transistor 320a, 320b and 320c may be exposed by the opening, and the first electrode 330a, 330b and 330c may be formed in the emission area EA1, EA2 and EA3 as an island shape.

Figure 7D:
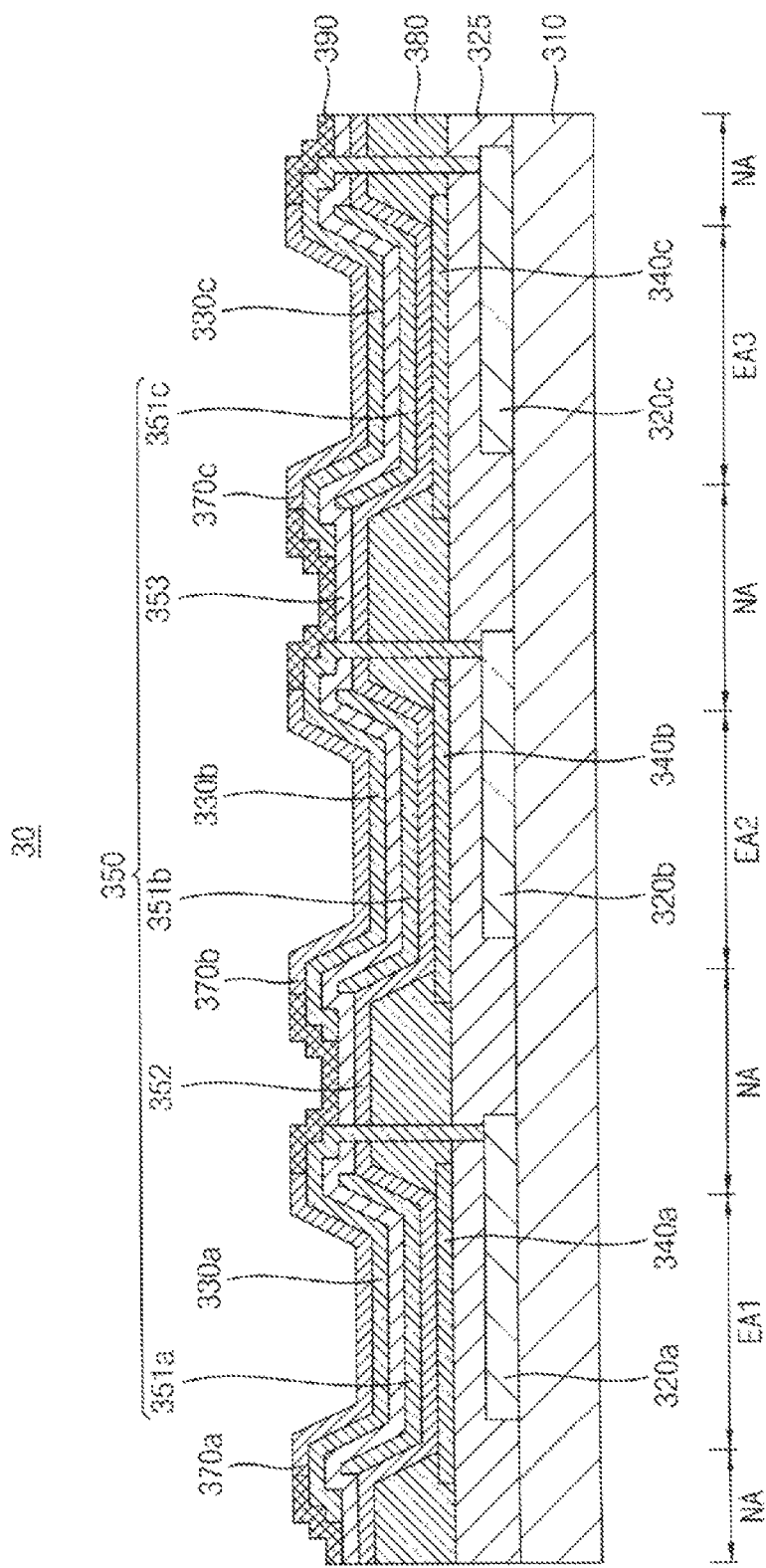

Referring to FIG. 7D, the external light reflection preventing layer 370a, 370b and 370c may be formed on the first electrode 330a, 330b and 330c. In example embodiments, the external light reflection preventing layer 370a, 370b and 370c may be formed in the emission area EA1, EA2 and EA3. In embodiments, the insulation layer 390 may be formed in the non-emission area NA on the first electrode 330a, 330b and 330c. For example, the external light reflection preventing layer 370a, 370b and 370c may be formed in the emission area EA1, EA2 and EA3 by using such as a printing process.

Figure 7E:
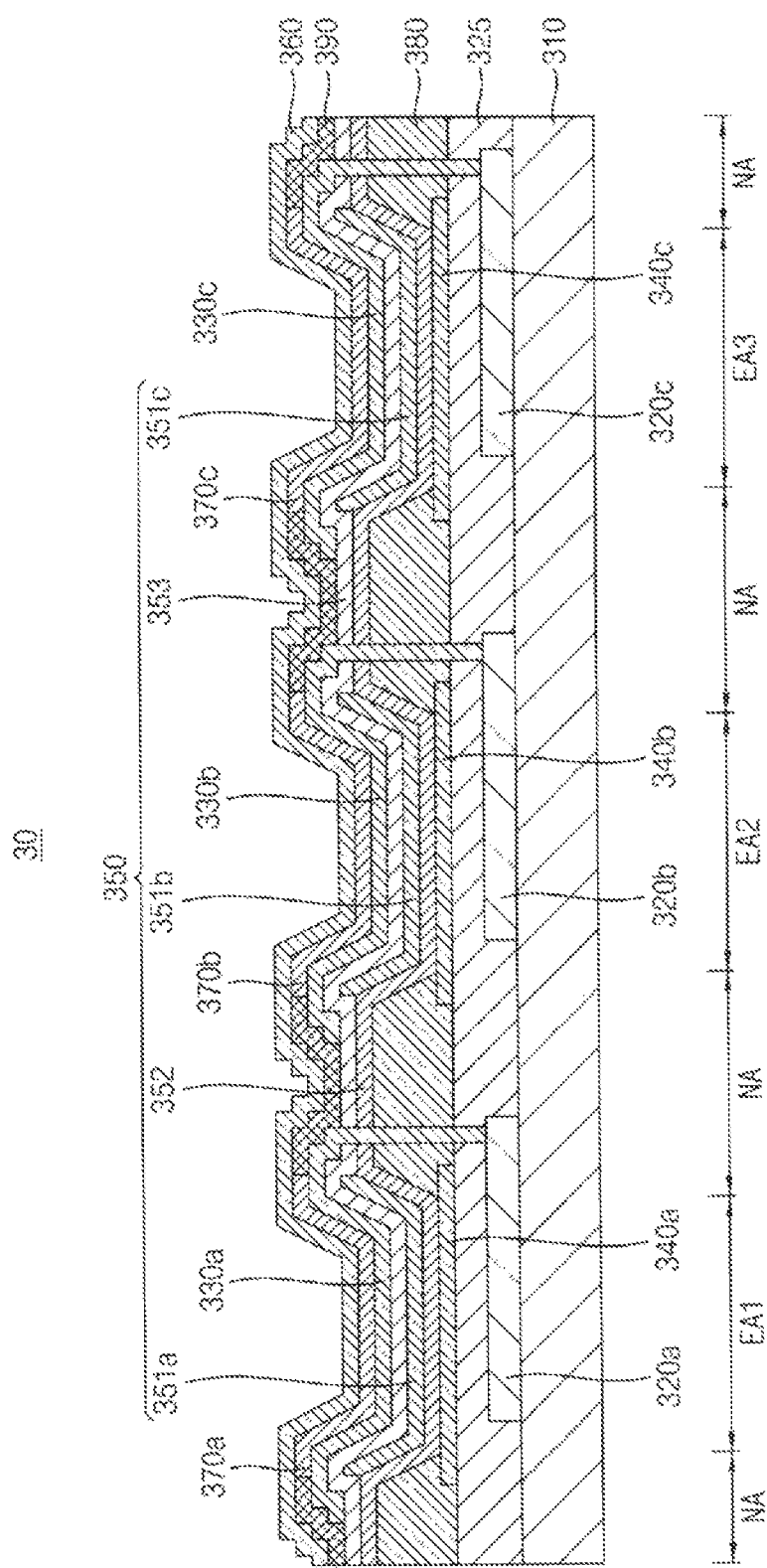

Referring to FIG. 7E, the third electrode 360 may be formed on the external light reflection preventing layer 370a, 370b and 370c. The third electrode 360 may be formed commonly from the emission area EA1, EA2 and EA3 to the non-emission area NA.

The organic light emitting display devices according to example embodiments may be applied to various display devices. For example, the organic light emitting display devices may be applied to one or more of computers, notebooks, mobile phones, smart phones, smart pads, personal media players (PMP), personal digital assistance (PDA), MP3 players, etc.

Although organic light emitting display devices in accordance with example embodiments have been described with reference to the accompanying drawings, practical embodiments are not limited thereto. Those skilled in the art will readily appreciate that many modifications are possible in the example embodiments without materially departing from the novel teachings and advantages within the scope defined by the claims.

What is claimed is:

1. A display device comprising:
 a first transistor;
 a first electrode, which is electrically connected to the first transistor;
 a second electrode, which overlaps the first electrode;
 a first intermediate layer, which is positioned between the first electrode and the second electrode, wherein a first electric field generated by the first electrode with the second electrode causes the first intermediate layer to emit first light;
 a first changeable layer, which overlaps the first electrode, wherein the first electric field generated by the first electrode with the second electrode causes the first changeable layer to change from having a second transmittance value to having a first transmittance value, wherein the second transmittance value is unequal to the first transmittance value;
 a second transistor, wherein no intervening transistor is positioned between the first transistor and the second transistor;
 a third electrode, which is electrically connected to the second transistor;
 a second intermediate layer, which is positioned between the third electrode and the second electrode and is configured to emit second light when the third electrode and the second electrode generate a second electric field; and
 a second changeable layer, which overlaps the third electrode, is configured to have the first transmittance value when the third electrode and the second electrode generate the second electric field, and is configured to have the second transmittance value when the third electrode and the second electrode do not generate the second electric field.

2. The display device of claim 1, further comprising a black member positioned between the first changeable layer and the second changeable layer.

3. The display device of claim 2, wherein the first intermediate layer is positioned between the first changeable layer and the black member.

4. The display device of claim 1, wherein a portion of the second electrode is positioned between the first changeable layer and the second changeable layer and directly contacts each of the first changeable layer and the second changeable layer.

5. The display device of claim 1, further comprising:
 a connection layer directly connected to each of the first changeable layer and the second changeable layer, wherein
 a material of the connection layer is identical to each of a material of the first changeable layer and a material of the second changeable layer, and
 the first changeable layer is connected through the connection layer to the second changeable layer.

6. The display device of claim 5, wherein:
 the connection layer has a recess, and
 the recess is positioned between the first changeable layer and the second changeable layer.

7. The display device of claim 5, further comprising:
 a black member, wherein
 the connection layer is positioned over the black member.

8. The display device of claim 7, wherein the connection layer is positioned between the black member and an end portion of the first changeable layer.

9. The display device of claim 5, further comprising:
 a fourth electrode electrically connected to the first electrode, wherein
 the first changeable layer is positioned between the second electrode and the fourth electrode, and
 the second electrode is positioned between the first electrode and the first changeable layer.

10. The display device of claim 9, wherein the first changeable layer directly contacts each of the second electrode and the fourth electrode.

11. The display device of claim 9, further comprising:
 a fifth electrode electrically connected to the third electrode, wherein
 the second changeable layer is positioned between the second electrode and the fifth electrode, and
 a recess of the connection layer is positioned between the fourth electrode and the fifth electrode.

12. A display device, comprising:
 a first transistor;
 a first electrode, which is electrically connected to the first transistor;
 a second electrode, which overlaps the first electrode;
 a first intermediate layer, which is positioned between the first electrode and the second electrode, wherein a first electric field generated by the first electrode with the second electrode causes the first intermediate layer to emit first light;
 a first changeable layer, which overlaps the first electrode, wherein the first electric field generated by the first electrode with the second electrode causes the first changeable layer to change from having a second transmittance value to having a first transmittance value, wherein the second transmittance value is unequal to the first transmittance value; and a third electrode, which is electrically connected to the second electrode, wherein the first changeable layer is positioned between the first electrode and the third electrode, and wherein the first electrode is positioned between the second electrode and the first changeable layer.

13. The display device of claim 12, further comprising:
a second transistor, wherein no intervening transistor is positioned between the first transistor and the second transistor;
a fourth electrode, which is electrically connected to the second transistor;
a fifth electrode, which overlaps the fourth electrode, is spaced from the second electrode, and is electrically connected to the third electrode;
a second intermediate layer, which is positioned between the fourth electrode and the fifth electrode and is configured to emit second light when the fourth electrode and the fifth electrode generate a second electric field; and
a second changeable layer, which is positioned between the fourth electrode and the third electrode, is configured to have the first transmittance value when the fourth electrode and the fifth electrode generate the second electric field, and is configured to have the second transmittance value when the fourth electrode and the fifth electrode do not generate the second electric field.

14. The display device of claim 13, wherein a portion of the third electrode is positioned between the first changeable layer and the second changeable layer and directly contacts each of the first changeable layer and the second changeable layer.

* * * * *